United States Patent
Cho et al.

(10) Patent No.: US 8,279,659 B2
(45) Date of Patent: Oct. 2, 2012

(54) SYSTEM AND METHOD OF OPERATING A MEMORY DEVICE

(75) Inventors: Sung Il Cho, San Diego, CA (US); Sei Seung Yoon, San Diego, CA (US); Naveen Gundubogula, San Diego, CA (US); Mohamed H. Abu-Rahma, San Diego, CA (US); Dongkyu Park, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 355 days.

(21) Appl. No.: 12/617,305

(22) Filed: Nov. 12, 2009

(65) Prior Publication Data

US 2011/0110174 A1    May 12, 2011

(51) Int. Cl.
*G11C 11/00*    (2006.01)
(52) U.S. Cl. .... 365/154; 365/194; 365/205; 365/230.06
(58) Field of Classification Search ................ 365/154, 365/194, 205, 230.06
See application file for complete search history.

(56) References Cited

U.S. PATENT DOCUMENTS

| | | |
|---|---|---|
| 4,528,646 A | 7/1985 | Ochii et al. |
| 4,947,379 A | 8/1990 | Okuyama |
| 5,132,931 A | 7/1992 | Koker |
| 5,424,985 A | 6/1995 | McClure et al. |
| 5,596,539 A | 1/1997 | Passow et al. |
| 5,627,789 A | 5/1997 | Kalb, Jr. |
| 5,828,622 A | 10/1998 | McClure |
| 6,711,052 B2 | 3/2004 | Subramanian et al. |
| 6,738,296 B2 | 5/2004 | Sung et al. |
| 7,069,522 B1 | 6/2006 | Sluss et al. |
| 7,248,508 B1 | 7/2007 | Frederick |
| 7,355,905 B2 | 4/2008 | Campbell et al. |
| 2006/0200332 A1 | 9/2006 | Ishimoto et al. |
| 2008/0037338 A1 | 2/2008 | Chen et al. |
| 2008/0037357 A1* | 2/2008 | Pelley et al. ............. 365/230.05 |
| 2008/0080266 A1 | 4/2008 | Khellah et al. |
| 2008/0101143 A1 | 5/2008 | Jung et al. |
| 2009/0034315 A1* | 2/2009 | Yu et al. ......................... 365/51 |
| 2009/0108899 A1 | 4/2009 | Bhatia et al. |
| 2010/0061162 A1* | 3/2010 | Burnett et al. ........... 365/189.09 |

OTHER PUBLICATIONS

Chen, Y.H. et al. "A 0.6V 45nm Adaptive Dual-Rail SRAM Compiler Circuit Design for Lower VDD_min VLSIs," IEEE 2008 Symposium on VLSI Circuits Digest of Technical Papers, pp. 210-211.

(Continued)

*Primary Examiner* — Hoai V Ho
(74) *Attorney, Agent, or Firm* — Sam Talpalatsky; Nicholas J. Pauley; Jonathan T. Velasco

(57) ABSTRACT

A system and method of operating a memory device is disclosed. In a particular embodiment, an apparatus is disclosed that includes a bit cell coupled to a first bit line and to a second bit line. The apparatus also includes a sense amplifier coupled to the first bit line and to the second bit line. The apparatus includes a loop circuit configured to provide a sense amplifier enable signal to the sense amplifier in response to receiving a first signal. The apparatus also includes a wordline enable circuit configured to provide a wordline enable signal to a wordline driver in response to receiving a second signal. The loop circuit receives the first signal before the wordline enable circuit receives the second signal.

32 Claims, 8 Drawing Sheets

OTHER PUBLICATIONS

Chen, Y.H. et al. "A 0.6V Dual-Rail Compiler SRAM Design on 45nm CMOS Technology with Adaptive SRAM Power for Lower VDD_min VLSIs," Apr. 2009 IEEE Journal of Solid-State Circuits, vol. 44, No. 4, pp. 1209-1215.

Fukano, G. et al. "A 65nm 1Mb SRAM Macro with Dynamic Voltage Scaling in Dual Power Supply Scheme for Low Power SoCs," 2008 IEEE, pp. 97-98.

Khellah, Muhammad et al. "A 256-Kb Dual VCC SRAM Building Block in 65-nm CMOS Process with Actively Clamped Sleep Transistor," Jan. 2007 IEEE Journal of Solid-State Circuits, vol. 42, No. 1, pp. 233-242.

Takashi, O. et al. "Migration of Cell Broadband Engine from 65nm SOI to 45nm SOI," Feb. 2008 IEEE International Solid-State Circuits Conference, pp. 86-87, 597.

International Search Report and Written Opinion—PCT/US2010/056384—ISA/EPO—Apr. 14, 2011.

* cited by examiner

SYSTEM AND METHOD OF OPERATING A MEMORY DEVICE

I. FIELD

The present disclosure is generally related to operating a memory device.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Reducing power consumption of portable personal computing enables an increased operating time between battery recharging or replacement. Reducing a supply voltage of electronic elements typically results in lower power consumption. However, some electronic elements may operate at a slower speed with a reduced supply voltage.

Such slower speed may impact operation of certain circuits within the electronic device. For example, some memory devices, such as static random access memory (SRAM) devices, may read a data value stored at a bit cell by precharging a pair of bit lines coupled to the bit cell and discharging one of the precharged bit lines based on a data value stored at the bit cell. A sense amplifier coupled to the bit lines may compare voltages at the bit lines and generate an output indicating the data value at the bit cell. The sense amplifier may be controlled in view of the competing requirements of waiting for a sufficient differential voltage development for a reliable result but reducing unnecessary delay for power efficiency. Power savings that may be achieved by lowering a supply voltage to memory control elements to reduce power consumption may be at least partially offset by an increased voltage difference at the bit lines when the lowered supply voltage causes delayed operation of the sense amplifier.

III. SUMMARY

A memory system is disclosed that is capable of operating at a range of logic supply voltages. A sense amplifier enable signal is generated at a loop circuit based on a first signal at the loop circuit, while a wordline activation is based on a later signal that is received at a wordline enable circuit. By controlling timing of the wordline enable circuit and the loop circuit, a memory device may be operated at a larger range of supply voltages.

For example, by initiating operation of the loop circuit prior to initiating operation of the wordline enable circuit, significant delays due to reduced logic supply voltage can be compensated for at the loop circuit to maintain a substantially constant delay between a wordline bias and a sense amplifier enable signal. As a result, an amount of differential voltage development during a memory read may be substantially unaffected by lowering the logic supply voltage, enabling increased power savings.

In a particular embodiment, an apparatus is disclosed that includes a bit cell coupled to a first bit line and to a second bit line. The apparatus also includes a sense amplifier coupled to the first bit line and to the second bit line. The apparatus further includes a loop circuit configured to provide a sense amplifier enable signal to the sense amplifier in response to receiving a first signal. The apparatus includes a wordline enable circuit configured to provide a wordline enable signal to a wordline driver circuit in response to receiving a second signal. The loop circuit receives the first signal before the wordline enable circuit receives the second signal.

In another particular embodiment, a method includes receiving an input signal at a memory device that includes a bit cell that is coupled to a wordline and that is coupled to a sense amplifier via a first bit line and a second bit line. The method includes, in response to receiving the input signal, sending a first signal to a loop circuit to initiate an operation of the loop circuit and sending a second signal to a wordline enable circuit to initiate generation of a wordline signal at the wordline. The first signal is sent before the second signal.

One particular advantage provided by at least one of the disclosed embodiments is that, because the loop circuit receives the first signal before the wordline enable signal receives the second signal, a delay of the loop circuit in generating a sense amplifier enable signal due to a reduced supply voltage can be accommodated even when the delay exceeds the time required for a threshold differential voltage to be developed after the second signal is received at the wordline enable circuit. As a result, lower power operation may be achieved than in systems where the loop circuit and the wordline enable circuit are triggered by a common signal.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
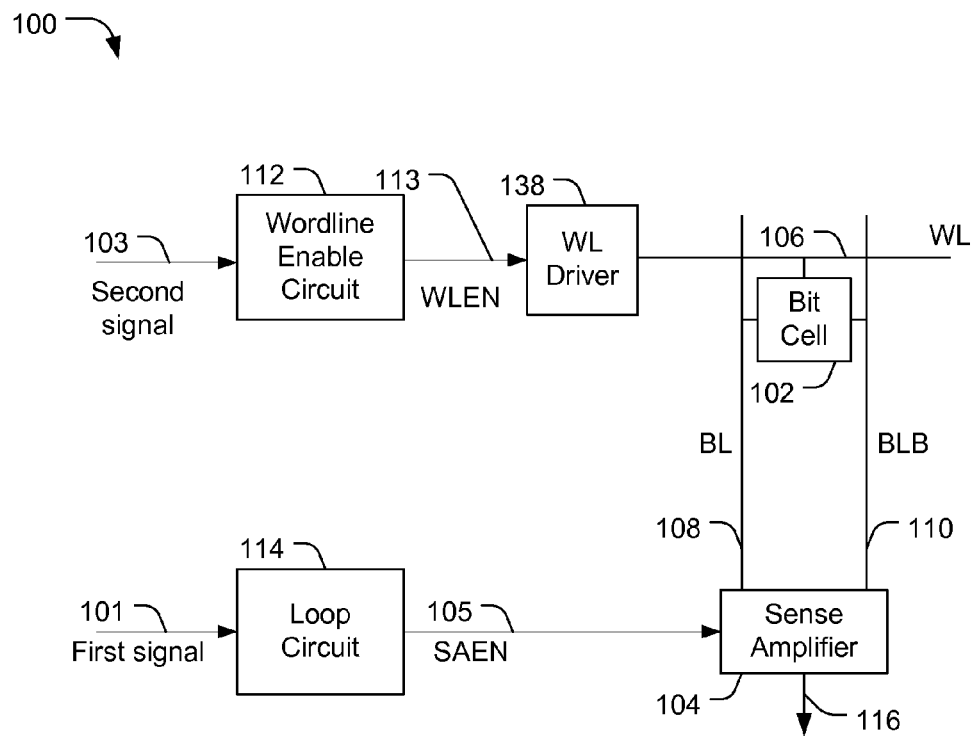
FIG. 1 is a block diagram of a first illustrative embodiment of a memory system having a loop circuit and a wordline enable circuit.
Figure 1:
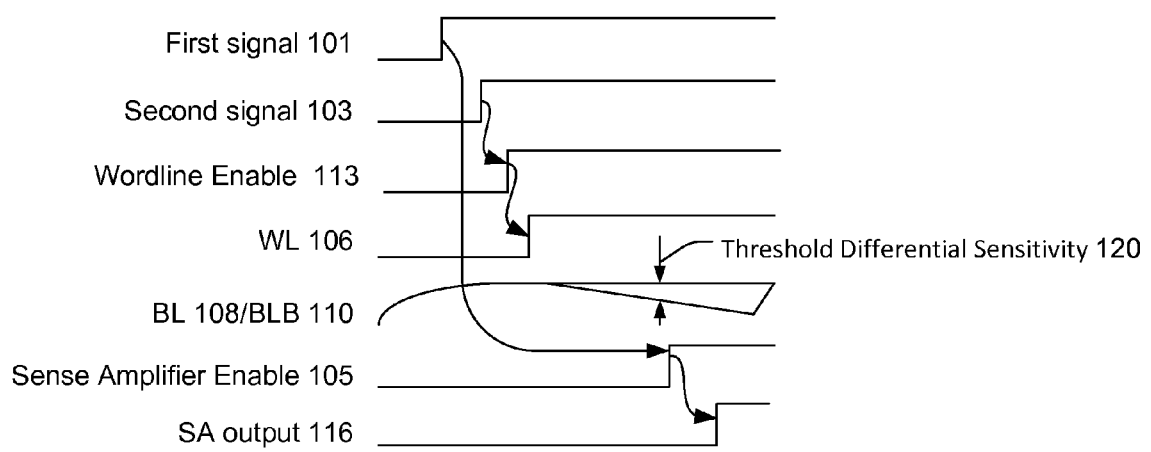

Referring to FIG. 1, a first illustrative embodiment of a system to retrieve data from a bit cell is depicted and is generally designated 100. The system 100 includes a representative bit cell 102 that is coupled to a wordline 106, a first bit line 108, and a second bit line 110. A sense amplifier 104 is coupled to the first bit line 108 and to the second bit line 110. A wordline enable circuit 112 is coupled to a wordline driver 138 that is coupled to the wordline 106. A loop circuit 114 is coupled to the sense amplifier 104. The loop circuit 114 is responsive to a first signal 101 and the wordline enable circuit 112 is responsive to a second signal 103. The first signal 101 is provided to the loop circuit 114 prior to the second signal 103 being provided to the wordline enable circuit 112. As a result, a timing of an operation of the loop circuit 114 may be adjusted to accommodate a delay within the loop circuit 114 due to a supply voltage value.

In a particular embodiment, the bit cell 102 is configured to store a data value, such as a logical high or logical low data value. For example, the bit cell 102 may be a bit cell of a static random access memory (SRAM). To illustrate, the bit cell 102 may be a 6-transistor (6T) bit cell. The bit cell 102 is responsive to a voltage at the wordline 106 to cause the bit cell 102 to be selectively coupled to the first and second bit lines 108 and 110. In a particular embodiment, a voltage applied to the wordline 106 may cause the bit cell 102 to apply a first voltage to the first bit line 108 and a second voltage to the second bit line 110. For example, the voltage applied to the first bit line 108 may represent a data value stored at the bit cell 102, and a complementary data value, such as the logical "not" of the value applied to the bit line 108, may be applied to the second bit line 110 (e.g., a bit line bar, or BLB).

In a particular embodiment, the sense amplifier 104 is configured to receive a first voltage via the first bit line 108 and a second voltage via the second bit line 110. The sense amplifier 104 is configured to generate an output value 116 indicative of a voltage differential between the first bit line 108 and the second bit line 110. For example, when the first bit line 108 has a higher voltage than the second bit line 110, the output value 116 may be a logical high value, and when the first bit line 108 has a lower voltage than the second bit line 110, the output value 116 may be a logical low value. The sense amplifier 104 may be responsive to a sense amplifier enable (SAEN) signal 105 that is received from the loop circuit 114. The sense amplifier 104 may have a threshold differential sensitivity, so that a voltage difference between the first bit line 108 and the second bit line 110 that exceeds the threshold differential sensitivity may be reliably read, while a voltage differential that does not exceed the threshold differential sensitivity may not be reliably read.

In a particular embodiment, the wordline enable circuit 112 is responsive to the second signal 103. The wordline enable circuit 112 is configured to provide a wordline enable (WLEN) signal 113 to the wordline driver 138 to enable access to the bit cell 102 via a wordline signal. For example, the wordline driver 138 may provide a wordline signal to the wordline 106, such as a voltage applied to the wordline 106 in response to the wordline enable signal 113 from the wordline enable circuit 112.

In a particular embodiment, the loop circuit 114 is responsive to the first signal 101 and is configured to provide the sense amplifier enable (SAEN) signal 105 to the sense amplifier 104. The loop circuit 114 may be further responsive to one or more signals (not shown) indicating a discharge of a bit line to determine a timing to initiate the sense amplifier enable signal 105. For example, when the first and second bit lines 108, 110 are precharged to a voltage level, and after the wordline 106 is biased with a voltage to couple the bit cell 102 to the bit lines 108, 110, an amount of time may lapse before a differential signal exceeding the threshold differential sensitivity at the bit lines 108 and 110 is achieved. As a result, a delay is introduced at the loop circuit 114 such that the sense amplifier enable signal 105 is provided to the sense amplifier 104 after a developed voltage differential at the bit lines 108 and 110 is sufficient for a reliable data read.

As illustrated in the various illustrative signal traces in the timing diagram of FIG. 1, the first signal 101 is activated prior to activation of the second signal 103. The loop circuit 114 receives the first signal 101 before the wordline enable circuit 112 receives the second signal 103. Although an activation is illustrated as a transition from a low logic level to a high logic level throughout the present disclosure, it will be understood that activation signals may include a transition from a high logic level to a low logic level, one or more pulses, or other activation signals. In addition, although some signal transitions are illustrated as instantaneous for clarity of illustration, any or all transitions may occur over a transition period and may not be instantaneous.

In response to the second signal 103 being activated, the wordline enable signal 113 is provided to the wordline driver 138. In response, the voltage of the wordline 106 is illustrated as transitioning from a low logic level to a high logic level. To illustrate, the wordline 106 may be provided to gates of n-type transistors, such as n-type field effect transistors (NFETs), to couple nodes of the bit cell 102 to the bit lines 108 and 110. In response to the wordline 106 voltage transitioning to a logical high value, a differential voltage between the precharged first bit line 108 and the precharged second bit line 110 begins to develop, increasing with time until the threshold differential sensitivity 120 is reached. Shortly after the threshold differential sensitivity 120 is reached, the sense amplifier enable signal 105 transitions from a low logic level to a high logic level, and in response to the transition of the sense amplifier enable signal 105, the sense amplifier 104 generates the sense amplifier output 116 having a value indicative of the differential voltage between the bit lines 108 and 110.

The system 100 may be used in electronic devices having various supply voltages. As the supply voltage decreases, however, a delay associated with logic transistors within the loop circuit 114 may increase. For example, as a supply voltage nears a threshold voltage of a transistor within the loop circuit 114, a current through the transistor may decrease, slowing an operation of circuitry within the loop circuit 114. Thus, the sense amplifier enable signal 105 may experience an increased delay responding to the first signal 101 as the supply voltage decreases, such as in various low power applications. As a result, if the sense amplifier enable signal 105 is delayed beyond the threshold differential sensitivity 120, power consumption due to the increasing voltage differential between the bit lines 108 and 110 increases. Thus, by providing the first signal 101 prior to the second signal 103, the sense amplifier 105 has additional time to adjust for a lower operating voltage. As a result, power consumption of the system 100 may be reduced and substantially improved over a range of operating voltages.

Figure 2:
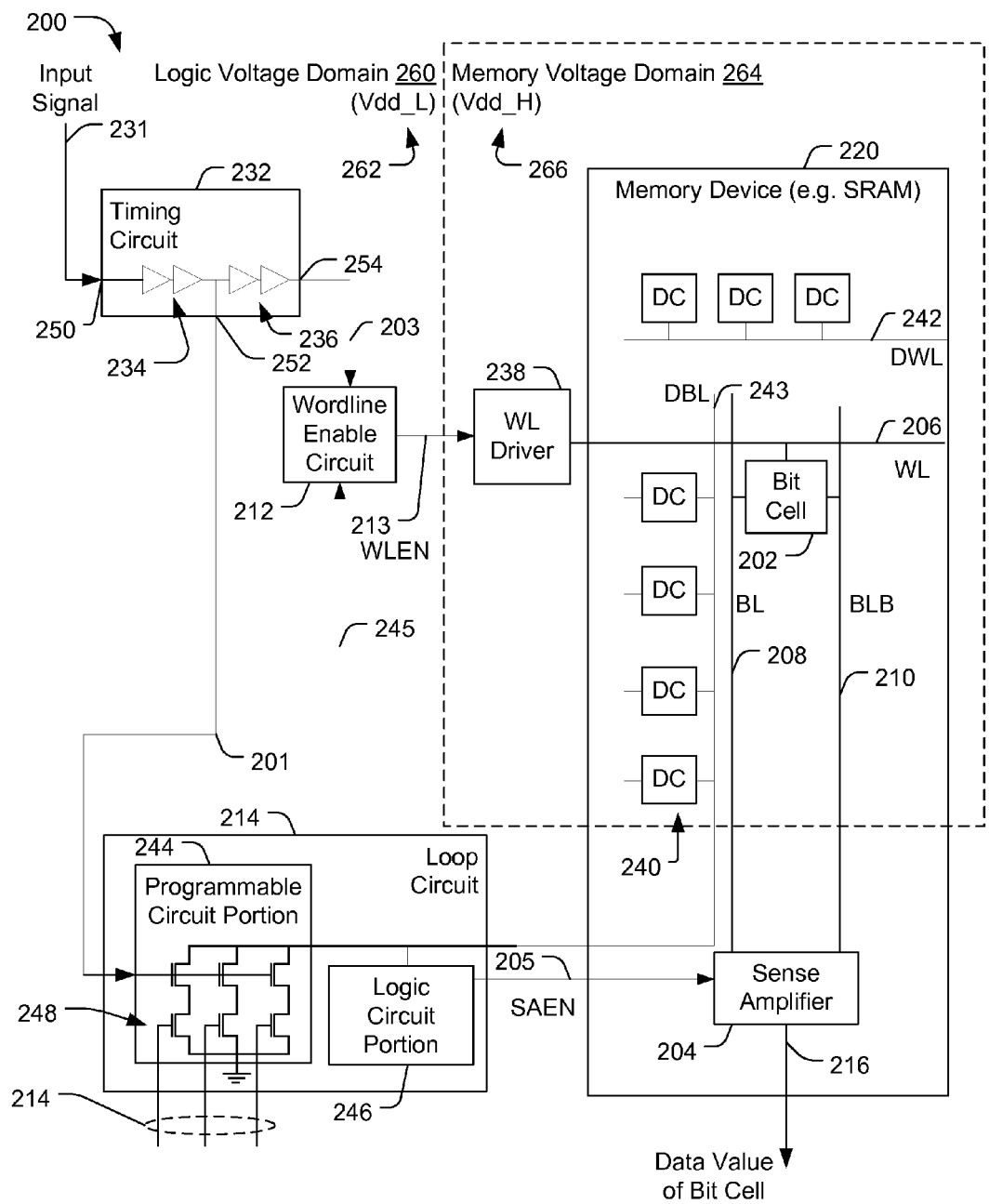
FIG. 2 is a diagram of a second illustrative embodiment of a memory system having a loop circuit and a wordline enable circuit.

Referring to FIG. 2, a second illustrative embodiment of a system to read data from a bit cell is depicted and generally designated 200. The system 200 includes a memory device 220 having a representative bit cell 202 coupled to a sense amplifier 204. The bit cell 202 is coupled to a wordline 206, to a first bit line 208, and to a second bit line 210. A wordline enable circuit 212 is coupled to a wordline driver 238. The wordline driver 238 is coupled to provide voltage representing a wordline signal to the wordline 206. A loop circuit 214 is coupled to provide an output to the sense amplifier 204 and to the wordline enable circuit 212. A timing circuit 232 is coupled to receive an input signal 231 and to provide a first signal 201 to the loop circuit 214 and a second signal 203 to the wordline enable circuit 212. In a particular embodiment, the system 200 FIG. 2 corresponds to the system 100 of FIG. 1.

In a particular embodiment, the timing circuit 232 includes an input 250 to receive the input signal 231. For example, the input signal 231 may be a clock signal. A first set of gates 234, such as serially coupled inverters, is adapted to apply a delay to the input signal 231 to generate the first signal 201 at a first output 252. The first signal 201 initiates an operation of the loop circuit 214. A second set of gates 236 generates the second signal 203 at a second output 254. Although the timing circuit 232 is illustrated having the first set of gates 234 and the second set of gates 236, in other embodiments the timing circuit 232 may include more gates, fewer gates, or other circuit elements, such that the timing circuit 232 is responsive to the input signal 231 and includes the first output 252 to provide the first signal 201 and the second output 254 to provide the second signal 203, where the first signal 201 occurs before the second signal 203.

In a particular embodiment, the wordline enable circuit 213 is configured to provide a wordline enable (WLEN) signal 213 to the wordline driver 238 in response to receiving the second signal 238. The wordline enable circuit 212 is responsive to the second signal 203 to generate the wordline enable signal 213. The wordline enable circuit 212 may also be responsive to a disable signal 245 from an output of the loop circuit 214 to disable the wordline enable signal 213. The wordline enable signal 213 is provided to the wordline driver 238.

In a particular embodiment, the wordline driver 238 is responsive to the wordline enable signal 213 sent from the wordline enable circuit 212. The wordline driver 238 may be adapted to apply a bias to the wordline 206 in response to the wordline enable signal 213. The wordline driver 238 and the memory device 220 that includes the representative bit cell 202 may exist in a memory voltage domain 264, while other components of the system 200 may exist in a logic voltage domain 260. The memory voltage domain 264 may have a higher supply voltage 266 (Vdd_H) than a supply voltage 262 (Vdd_L) of the logic voltage domain 260. A level shifter (not shown) may be coupled between the wordline enable circuit 212 and the wordline driver 238 to adjust a voltage of the wordline enable signal 213 from the logic voltage domain 260 to the memory voltage domain 264.

In a particular embodiment, the memory device 220 includes the representative bit cell 202, the wordline 206, the bit lines 208 and 210, and the sense amplifier 204. For example, the memory device 220 may be a SRAM device and the bit cell 202 may be a 6T bit cell. The memory device 220 may also include a dummy wordline 242 that is coupled to a dummy bit line 243 via multiple dummy cells 240. The dummy wordline 242, the dummy bit line 243, and the dummy cells 240 may simulate an amount of capacitance and load that may occur on the wordline 206 and one or more of the bit lines 208 and 210. The dummy bit line 243 may be provided to the loop circuit 214 to enable the loop circuit 214 to obtain timing information related to a discharge of the bit lines 208 and 210. For example, the dummy bit line 243 may be precharged and a time of discharge of the precharged dummy bit line 243 may approximate a discharge time of one of the bit lines 208 and 210 under a variety of process, voltage, temperature, or other operating conditions. The dummy bit line 243 may therefore be used to time a sense amplifier enable signal 205 according to operating conditions that may impact development of the differential voltage at the bit lines 208, 210.

In a particular embodiment, the loop circuit 214 is coupled to the dummy bit line 243 and includes a programmable circuit portion 244. The loop circuit 214 also includes a logic circuit portion 246. The loop circuit 214 is programmable to adjust a delay of the sense amplifier enable signal 205. For example, the loop circuit 214 may be programmable to maintain a substantially constant delay between activation of the wordline signal at the wordline 206 and activation of the sense amplifier enable signal 205. The substantially constant delay may be substantially independent of a supply voltage of the logic domain voltage 260, such as the supply voltage Vdd_L 262. In a particular embodiment, the programmable circuit portion 244 includes multiple discharge devices 248 that are coupled to the dummy bit line 243 and that are controllable to enable an adjustable rate of discharge of the precharged dummy bit line 243. For example, a discharge of the dummy bit line 243 is enabled by the first signal 201. The control signal 214 may include one or more signals to the multiple discharge devices 248, such as to bias one or more gates of switching transistors, to increase or decrease a discharge rate of the precharged dummy bit line 243.

The logic circuit portion 246 is responsive to the discharge of the dummy bit line 243 and generates the sense amplifier enable signal 205. Because the logic circuit portion 246 includes circuitry that may operate at a reduced speed as the logic domain supply voltage Vdd_L 262 is decreased, the programmable circuit portion 244 may be controlled to compensate for a delay of the logic circuit portion 246 such that a delay between the wordline 206 being activated and the sense amplifier 204 being enabled remains substantially constant independent of the supply voltage 262 of the logic voltage domain 260.

Figure 3:
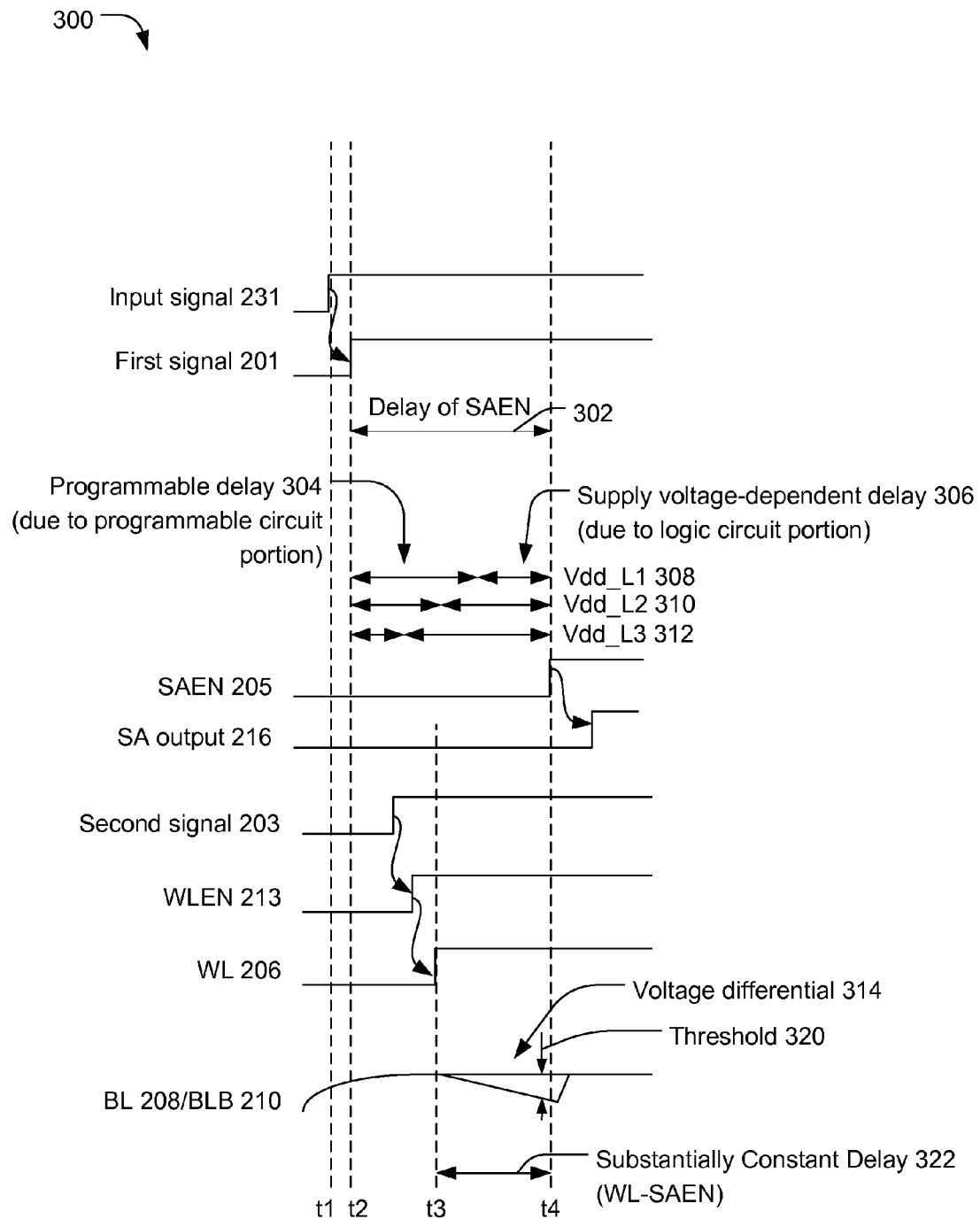
FIG. 3 is a timing diagram of a particular embodiment of signals of the memory system of FIG. 2.

Operation of the system 200 is described with respect to FIG. 3, which depicts a timing diagram of a particular embodiment of signals of the system 200. The input signal 231 is generated, illustrated as transitioning from low to high, at a time t1. In response to the input signal 231, the first signal 201 is generated at time t2. In addition, the second signal 203 is generated after the time t2.

In response to the first signal 201, the sense amplifier enable signal 205 is generated. The sense amplifier enable signal 205 triggers an operation of the sense amplifier output 216. A delay 302 of the sense amplifier enable signal, from the transition of the first signal 201 to the transition of the sense amplifier enable signal 205, includes a programmable delay 304 attributable to the programmable portion 244 and a supply voltage-dependent delay 306 attributable to the logic circuit portion 242. For example, at a first supply voltage Vdd_L1 308, the supply voltage-dependent delay 306 is relatively short, while the programmable delay 304 is relatively long. As the supply voltage is decreased, such as at Vdd_L2 310 and Vdd_L3 312, the supply voltage-dependent delay 306 increases, and the programmable delay 304 decreases in order to maintain the substantially constant delay 302 of the sense amplifier enable signal 205.

In response to the second signal 203, the wordline enable circuit 212 generates the wordline enable signal 213. In response to the wordline enable signal 213, the wordline driver 238 transitions the logical low voltage at the wordline 206 to a logical high voltage at a time t3. In response to the transition of the wordline 206, the pre-charged bit lines 208 and 210 begin to develop a voltage differential 314 that increases from the time t3 until shortly after a time t4. When the voltage differential 314 exceeds a threshold 320, such as a threshold differential sensitivity of the sense amplifier 204, the sense amplifier enable signal 205 transitions at time t4. After the sense amplifier enable signal 205 transitions at the time t4, the sense amplifier output 210 generates the sense amplifier output signal 216 indicative of the data value stored at the representative bit cell 202.

By controlling the programmable portion 244 of the loop circuit 214, the delay 302 of the sense amplifier enable signal 205 may be substantially constant. As a result, a substantially constant delay 322 between the wordline 206 transitioning and the sense amplifier 204 reading the differential value may be maintained. The substantially constant delay 322 may be programmed so that the voltage differential 314 exceeds the threshold differential sensitivity 320 before the sense amplifier 204 generates the output 216 indicative of a data value of the bit cell 202. The substantially constant delay 322 can additionally be programmed so that the sense amplifier 204 operates before substantial additional power consumption occurs due to the developing voltage differential 314.

Because the loop circuit 214 is responsive to the first signal 201 that occurs prior to the second signal 203, the substantially constant delay 322 may be maintained over a greater range of the supply voltage Vdd_L 262 than if the loop circuit 214 and the wordline enable circuit 212 were directly responsive to a common signal. For example, if the loop circuit 214 was responsive to the second signal 203, the delay 302 of the sense amplifier enable signal 205 should not exceed the delay between the second signal 203 and the voltage differential 314 satisfying the threshold 320 to prevent unnecessary power consumption. At the first illustrated supply voltage Vdd_L1 308, the programmable delay 304 may be adjusted to shorten the delay 302 so that the sense amplifier enable signal 205 occurs at time t4. However, as the supply voltage 262 of the logic voltage domain 260 is reduced, the supply voltage-dependent delay 306 increases. At the smallest illustrated supply voltage, Vdd_L3 312, the increase in the voltage-dependent delay 306 may be too large to be offset by a decrease in the programmable delay 304 to maintain the sense amplifier enable signal 205 at time t4. As a result, with decreasing supply voltage, the sense amplifier enable signal 205 would begin to fire after time t4, with a corresponding increase in power consumption due to the greater development of the voltage differential 314. Instead, by initiating operation of the loop circuit based on the first signal 201 prior to the second signal 203, the loop circuit 214 has an increased timing window (from t2 to t4) and can maintain the substantially constant delay 322 at the reduced supply voltage Vdd_L3 312.

To illustrate, operation of the system 200 using the supply voltage Vdd_L3 312 of the logic voltage domain 260 causes the delay 306 of the logic circuit portion 246 of the loop circuit 214 to exceed the substantially constant delay 322. Thus, if the loop circuit 214 were responsive to the second signal 203, the substantially constant delay 322 could not be maintained at the supply voltage Vdd_L3 312. However, as illustrated in FIG. 3, the loop circuit 214 receiving the first signal 201 before the wordline enable circuit 212 receives the second signal 203 enables the programmable circuit portion 244 of the loop circuit 214 to compensate for the delay 306 of the logic circuit portion 246 to maintain the substantially constant delay 322. Advancing the first signal 201 as compared to the second signal 203 increases the timing margin available to the programmable circuit portion 244 to compensate for the delay 306 due to the logic circuit portion 246 and enables a lower supply voltage 262 to be used by the system 200 while maintaining the substantially constant delay 322.

Figure 4:
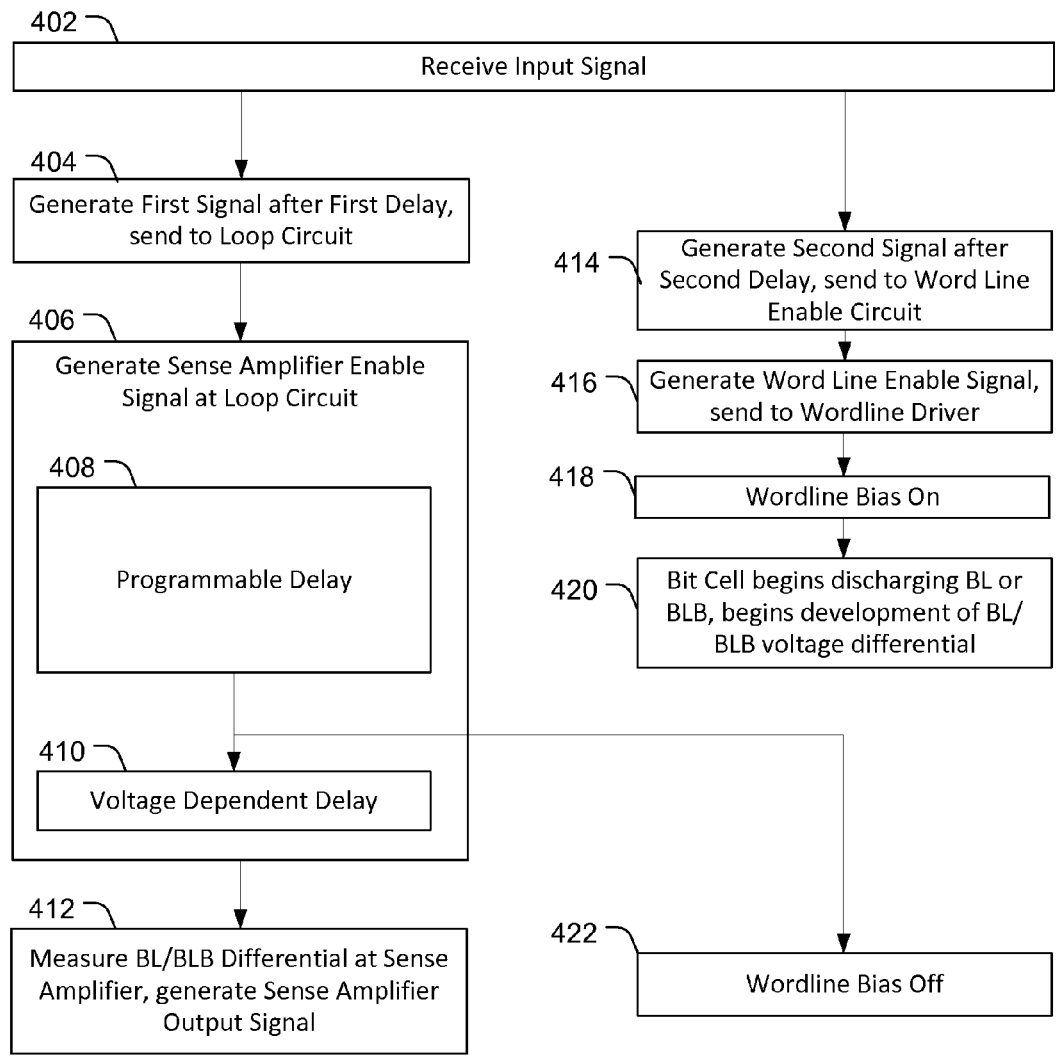
FIG. 4 is a flow chart of a particular illustrative embodiment of a method of operation of the system of FIG. 2.

Referring to FIG. 4, a particular embodiment of a method of operating the system of FIG. 2 is illustrated. The input signal 231 is received, at 402. The first signal 201 is generated after a first delay and sent to the loop circuit 214, at 404. The first delay corresponds to a propagation time through the first set 234 of gates at the timing circuit 232.

The sense amplifier enable signal 205 is generated at the loop circuit, at 406. The sense amplifier enable signal 205 may be generated after the precharged dummy bit line 243 is discharged via one or more of the multiple discharge devices 248, corresponding to a programmable delay 408. In response to the dummy bit line 243 being discharged, the sense amplifier enable signal 205 is generated by the logic circuit portion 246 of the loop circuit 214 after a voltage dependent delay 410.

At 412, the sense amplifier 204 receives the sense amplifier enable signal 205 and generates the sense amplifier output signal 216 based on the bit line-bit line bar (BL/BLB) voltage differential at the first bit line 208 and the second bit line 210.

After generating the first signal 201, at 404, the second signal 203 is generated after a second delay, at 414. The second delay may correspond to a propagation time through the second set 236 of gates at the timing circuit 232. The second signal 203 is provided to the word line enable circuit 212.

The wordline enable circuit 212 generates the wordline enable signal 213 that is sent to the wordline driver 238, at 416. The wordline driver 238 generates a wordline signal on the wordline 206. For example, the wordline driver 238 may apply a bias to the wordline 206 to turn on access transistors at the bit cell 202, at 418.

The wordline signal causes the bit cell 202 to begin discharging either the first bit line 208 or the second bit line 210 (e.g. BL or BLB) and initiates development of the BL/BLB voltage differential, at 420. The BL/BLB voltage differential continues to develop until the wordline bias is turned off, at 422. For example, in response to the dummy bit line 243 discharging, the disable signal 245 may be provided to the wordline enable circuit 212. The wordline enable circuit 212 may respond to the disable signal 245 by turning off the wordline enable signal 213, causing the wordline driver 238 to bias the wordline 206 at a logical low level.

The method of FIG. 4 may be performed at a processor integrated into an electronic device. For example, as will be described with respect to FIG. 7, sending the first signal 201 may be initiated by a computer or other electronic device. Alternatively, or in addition, one of skill in the art will recognize that the method 400 of FIG. 4 may be implemented or initiated by a field programmable gate array (FPGA), an application-specific integrated circuit (ASIC), a central processing unit (CPU), a digital signal processor (DSP), a controller, another hardware device, or any combination thereof.

Figure 5:
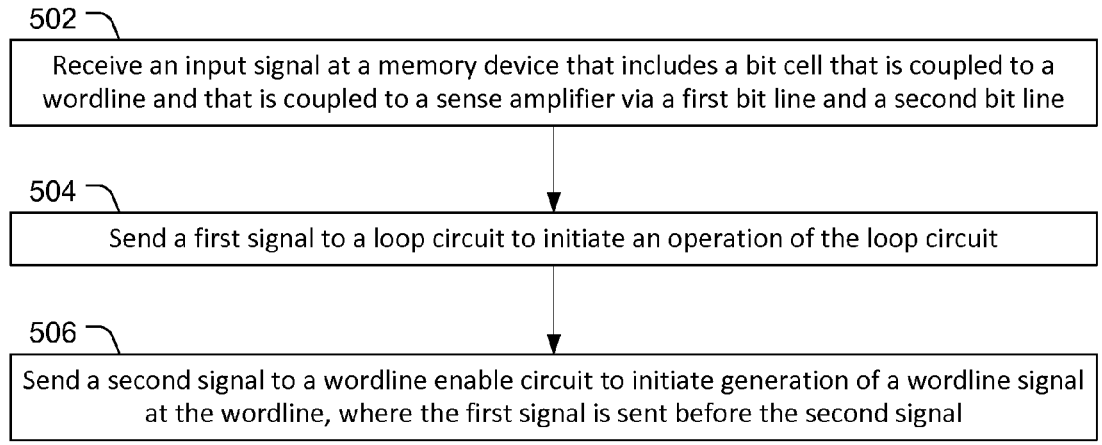
FIG. 5 is a flow chart of a first particular illustrative embodiment of a method of operating a memory system.

Referring to FIG. 5, a first embodiment of a method of operating a memory system is depicted. In an illustrative embodiment, the method may be performed at the system of FIG. 1 or FIG. 2. The method includes receiving an input signal at a memory device that includes a bit cell that is coupled to a wordline and that is coupled to a sense amplifier via a first bit line and a second bit line, at 502. For example, the input signal 231 of FIG. 2 is received at the timing circuit 232 of the memory system 200 that also includes the bit cell 202 coupled to the sense amplifier 204 via bit lines 208 and 210.

The method includes, in response to receiving the input signal, sending a first signal to a loop circuit to initiate an operation of the loop circuit, at 504, and sending a second signal to a wordline enable circuit to initiate generation of a wordline signal at the wordline, at 506. The first signal is sent before the second signal. For example, the first signal 201 of FIG. 2 is provided to the loop circuit 214 before the second signal 203 is provided to the wordline enable circuit 212.

By sending the first signal before the second signal, the loop circuit may be adjusted to achieve a substantially constant delay between a wordline signal and a sense amplifier enable signal. The substantially constant delay may be substantially independent of a logic domain voltage. Power consumption may therefore be reduced by operation at a reduced logic domain voltage without substantially increasing dynamic power consumption during memory reads.

The method of FIG. 5 may be performed at a processor integrated into an electronic device. For example, as will be described with respect to FIG. 7, the first signal 201 may be generated by a computer or other electronic device. Alternatively, or in addition, one of skill in the art will recognize that the method 500 of FIG. 5 may be implemented or initiated by a field programmable gate array (FPGA), an application-specific integrated circuit (ASIC), a central processing unit (CPU), a digital signal processor (DSP), a controller, another hardware device, or any combination thereof.

Figure 6:
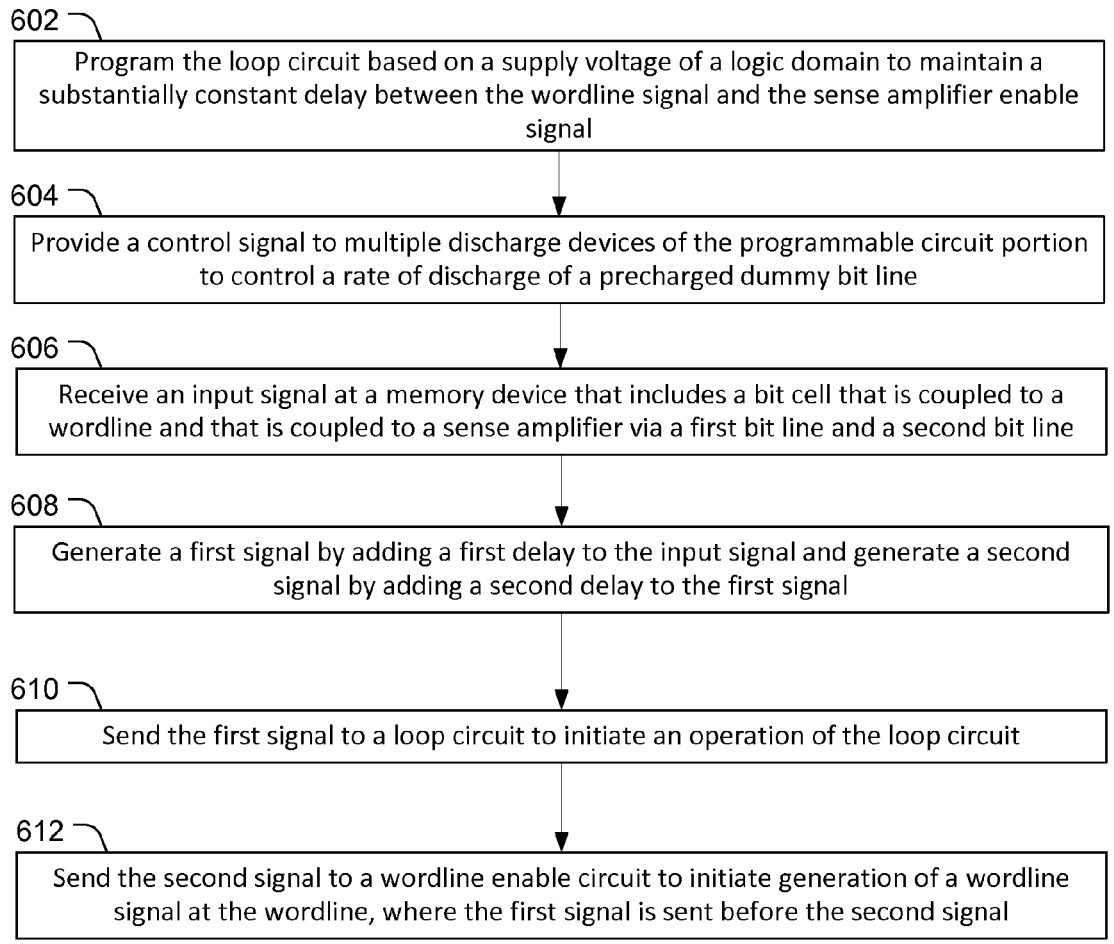
FIG. 6 is a flow chart of a second particular illustrative embodiment of a method of operating a memory system.

Referring to FIG. 6, a second embodiment of a method of operating a memory system is depicted. In an illustrative embodiment, the method may be performed at the system of FIG. 1 or FIG. 2.

The method may include programming a loop circuit based on a supply voltage of a logic domain to maintain a substantially constant delay between a wordline signal and a sense amplifier enable signal, at 602. The substantially constant delay is substantially independent of a logic domain voltage. For example, the loop circuit 214 of FIG. 2 may be programmed based on the supply voltage Vdd_L 262 to maintain the substantially constant delay 322 of FIG. 3.

In a particular embodiment, a control signal is provided to multiple discharge devices of the programmable circuit portion to control a rate of discharge of a precharged dummy bit line, at 604. For example, the control signal may be the control signal 214 of FIG. 2 provided to the multiple discharge devices 248 to control a rate of discharge of the precharged dummy bit line 243.

An input signal is received at a memory device that includes a bit cell that is coupled to a wordline and that is coupled to a sense amplifier via a first bit line and a second bit line, at 606. For example, the input signal 231 of FIG. 2 is received at the timing circuit 232 of the memory system 200 that also includes the bit cell 202 coupled to the sense amplifier 204 via bit lines 208 and 210.

The method also includes, in response to receiving the input signal, generating a first signal by adding a first delay to the input signal and generating a second signal by adding a second delay to the first signal, at 608. For example, the first signal may be the first signal 201 of FIG. 2 and the second signal may be the second signal 203 of FIG. 2. The first signal may be generated by a first set of delay elements, such as the first set of gates 234 of FIG. 2, and the second signal may be generated by a second set of delay elements, such as by serially coupling the first and second set of gates 234 and 236 of FIG. 2.

The first signal is sent to the loop circuit to initiate an operation of the loop circuit, at 610, and a second signal is sent to a wordline enable circuit to initiate generation of a wordline signal at the wordline, at 612. The first signal is sent before the second signal. In a particular embodiment, the operation of the loop circuit generates the sense amplifier enable signal to enable the sense amplifier to detect a voltage differential of the first bit line and the second bit line. For example, the first signal 201 of FIG. 2 is provided to the loop circuit 214 before the second signal 203 is provided to the wordline enable circuit 212.

The wordline enable circuit may be in a logic voltage domain having a first supply voltage, such as the first supply voltage Vdd_L 262 of FIG. 2, and the bit cell may be in a memory voltage domain having a second supply voltage, such as the second supply voltage Vdd_H 266 of FIG. 2. The loop circuit may include a programmable circuit portion and a logic circuit portion, such as the programmable circuit portion 244 and the logic circuit portion 246. The programmable circuit portion may be adjustable to compensate for a delay of the logic circuit portion due to a supply voltage level of the logic voltage domain.

The method of FIG. 6 may be performed at a processor integrated into an electronic device. For example, as will be described with respect to FIG. 7, the first signal 201 may be generated by a computer or other electronic device. Alternatively, or in addition, one of skill in the art will recognize that the method 600 of FIG. 6 may be implemented or initiated by a field programmable gate array (FPGA), an application-specific integrated circuit (ASIC), a central processing unit (CPU), a digital signal processor (DSP), a controller, another hardware device, or any combination thereof.

Figure 7:
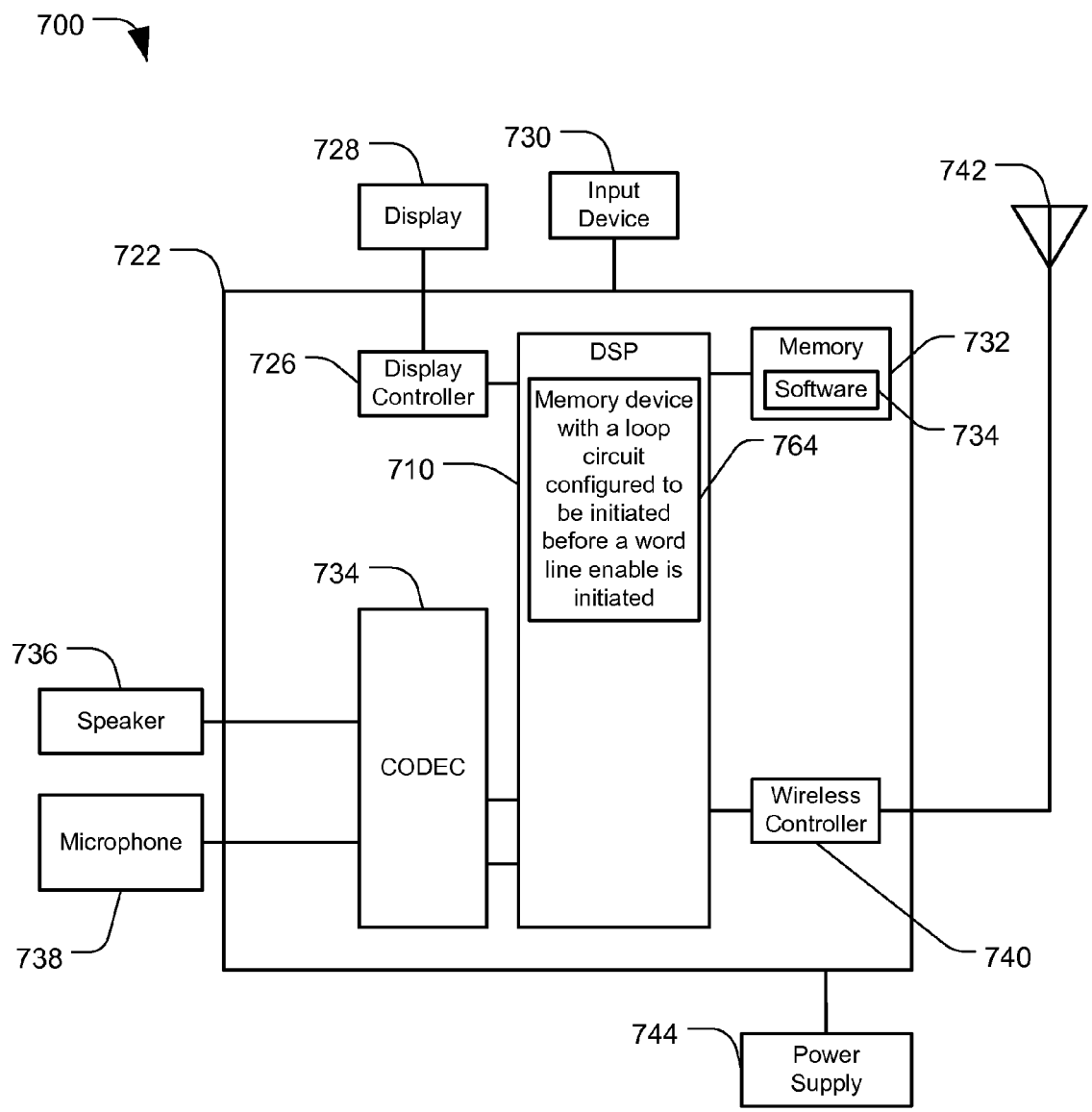
FIG. 7 is a block diagram of a portable device including a memory system having a loop circuit that is enabled before a wordline enable circuit.

Referring to FIG. 7, a block diagram of a particular illustrative embodiment of an electronic device including a memory device having a loop circuit that is configured to be initiated before a wordline enable is initiated is depicted and generally designated 700. The device 700 includes a processor 710, such as a digital signal processor (DSP), coupled to a memory 732 and including a memory device 764 with a loop circuit configured to be initiated before a wordline enable is initiated. In an illustrative example, the memory device 764 includes the memory system depicted in FIG. 1 or FIG. 2, operates in accordance with one or more of FIGS. 3-6, or any combination thereof.

The processor 710 may include the memory device 764, such as a register file or other embedded memory, and may include circuitry to enable sending the first signal and the second signal, such as the timing circuit 232 of FIG. 2. In a particular embodiment, the processor 710 may implement one or more of the methods of FIGS. 4-6. In another embodiment, the memory device 764 may be external to the processor 710 and the processor 710 may be configured to initiate memory operations at the memory device 764, such as by generating the input signal 201 to initiate a memory read operation at the memory device 764.

For example, the memory 732 coupled to the processor 710 may be a computer readable tangible medium storing software 734 including computer executable instructions that are executable by the processor 710 to generate an input signal at a memory device that includes a bit cell. The bit cell is coupled to a wordline and is coupled to a sense amplifier via a first bit line and a second bit line, such as the memory system 200 of FIG. 2. In response to receiving the input signal, a first signal is sent to a loop circuit to initiate an operation of the loop circuit. In response to receiving the input signal, a second signal is sent to a wordline enable circuit to initiate generation of a wordline signal at the wordline, The first signal is sent before the second signal, as illustrated by the first signal 201 and the second signal 203 in the timing diagram of FIG. 3. The operation of the loop circuit may generate a sense amplifier enable signal to enable the sense amplifier to detect a voltage differential of the first bit line and the second bit line.

The software 734 may further include instructions that are executable to program the loop circuit based on a supply voltage of a logic domain to maintain a substantially constant delay between the wordline signal and the sense amplifier enable signal. For example, the processor 710 may set one or more voltages of the control signal 214 of FIG. 2 to selectively operate one or more of the discharge elements 248 to maintain the substantially constant delay 322 (illustrated in FIG. 3) based on a logic supply voltage of the processor 710.

FIG. 7 also shows a display controller 726 that is coupled to the processor 710 and to a display 728. A coder/decoder (CODEC) 734 can also be coupled to the processor 710. A speaker 736 and a microphone 738 can be coupled to the CODEC 734.

FIG. 7 also indicates that a wireless controller 740 can be coupled to the processor 710 and to a wireless antenna 742. In a particular embodiment, the processor 710, the display controller 726, the memory 732, the CODEC 734, the wireless controller 740, and the memory device 764 are included in a system-in-package or system-on-chip device 722. In a particular embodiment, an input device 730 and a power supply 744 are coupled to the system-on-chip device 722. Moreover, in a particular embodiment, as illustrated in FIG. 7, the display 728, the input device 730, the speaker 736, the microphone 738, the wireless antenna 742, and the power supply 744 are external to the system-on-chip device 722. However, each of the display 728, the input device 730, the speaker 736, the microphone 738, the wireless antenna 742, and the power supply 744 can be coupled to a component of the system-on-chip device 722, such as an interface or a controller.

Figure 8:
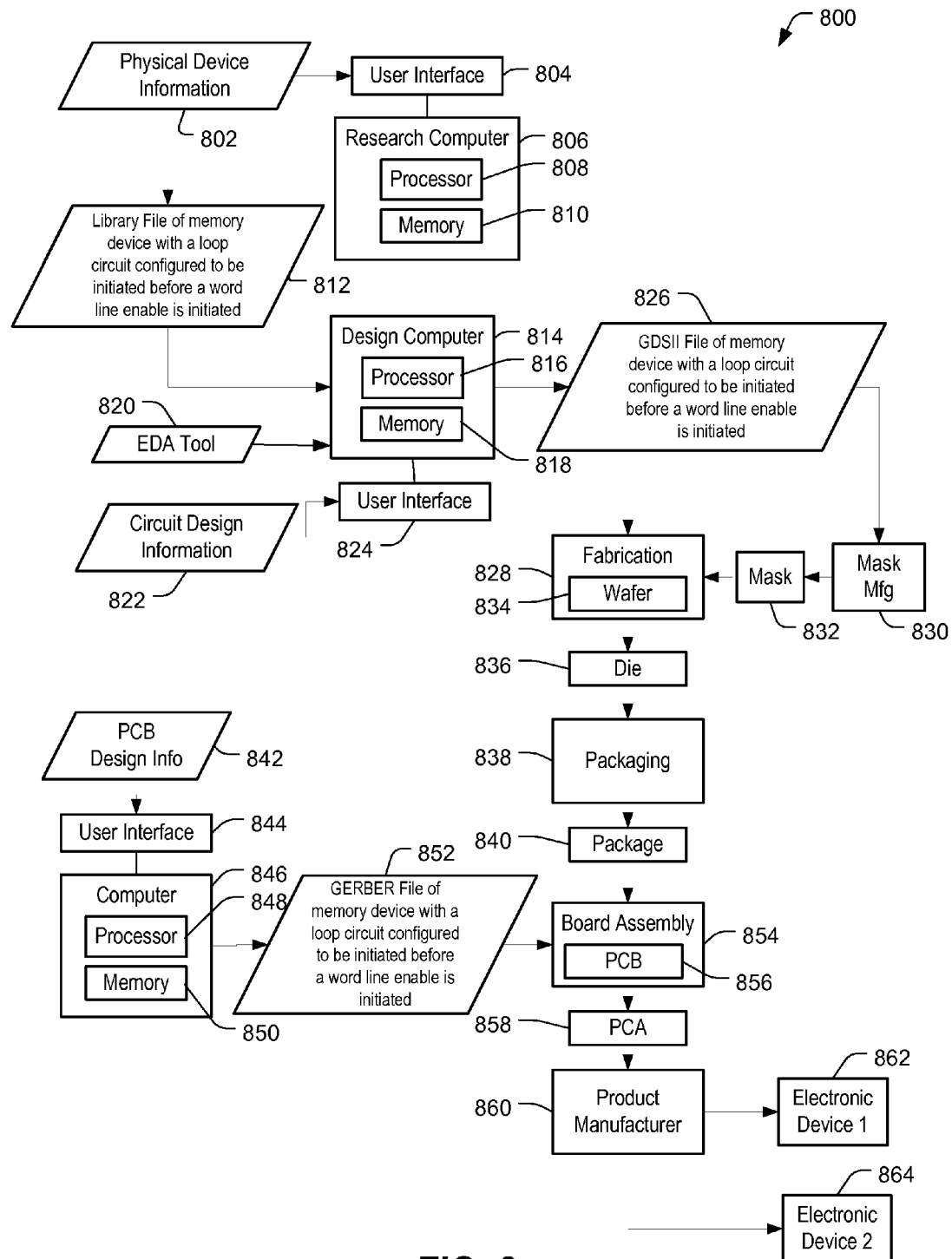
FIG. 8 is a data flow diagram of a particular illustrative embodiment of a manufacturing process to manufacture electronic devices that include a memory system having a loop circuit that is enabled before a wordline enable circuit.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 8 depicts a particular illustrative embodiment of an electronic device manufacturing process 800.

Physical device information 802 is received in the manufacturing process 800, such as at a research computer 806. The physical device information 802 may include design information representing at least one physical property of a semiconductor device, such as the systems of FIGS. 1-2. For example the physical device information 802 may include physical parameters, material characteristics, and structure information that is entered via a user interface 804 coupled to the research computer 806. The research computer 806 includes a processor 808, such as one or more processing cores, coupled to a computer readable medium such as a memory 810. The memory 810 may store computer readable instructions that are executable to cause the processor 808 to transform the physical device information 802 to comply with a file format and to generate a library file 812.

In a particular embodiment, the library file 812 includes at least one data file including transformed design information. For example, the library file 812 may include a library of semiconductor devices including the system of FIG. 1 or FIG. 2 that is provided for use with an electronic design automation (EDA) tool 820.

The library file 812 may be used in conjunction with the EDA tool 820 at a design computer 814 including a processor 816, such as one or more processing cores, coupled to a memory 818. The EDA tool 820 may be stored as processor executable instructions at the memory 818 to enable a user of the design computer 814 to design a circuit using the system of FIG. 1 or FIG. 2, or any combination thereof, of the library file 812. For example, a user of the design computer 814 may enter circuit design information 822 via a user interface 824 coupled to the design computer 814. The circuit design information 822 may include design information representing at least one physical property of a semiconductor device, such as the system of FIG. 1 or FIG. 2, or any combination thereof. To illustrate, the circuit design information may include identification of particular circuits and relationships to other elements in a circuit design, positioning information, feature size information, interconnection information, or other information representing a physical property of a semiconductor device.

The design computer 814 may be configured to transform the design information, including the circuit design information 822 to comply with a file format. To illustrate, file formation may include a database binary file format representing planar geometric shapes, text labels, and other information about a circuit layout in a hierarchical format, such as a Graphic Data System (GDSII) file format. The design computer 814 may be configured to generate a data file including the transformed design information, such as a GDSII file 826 that includes information describing the system of FIG. 1 or FIG. 2, or any combination thereof, in addition to other circuits or information. To illustrate, the data file may include information corresponding to a system-on-chip (SOC) that includes the system of FIG. 1 and that also includes additional electronic circuits and components within the SOC.

The GDSII file 826 may be received at a fabrication process 828 to manufacture the system of FIG. 1 or FIG. 2, or any combination thereof, according to transformed information in the GDSII file 826. For example, a device manufacture process may include providing the GDSII file 826 to a mask manufacturer 830 to create one or more masks, such as masks to be used for photolithography processing, illustrated as a representative mask 832. The mask 832 may be used during the fabrication process to generate one or more wafers 834, which may be tested and separated into dies, such as a representative die 836. The die 836 includes a circuit including the system of FIG. 1 or FIG. 2, or any combination thereof.

The die 836 may be provided to a packaging process 838 where the die 836 is incorporated into a representative package 840. For example, the package 840 may include the single die 836 or multiple dies, such as a system-in-package (SiP) arrangement. The package 840 may be configured to conform to one or more standards or specifications, such as Joint Electron Device Engineering Council (JEDEC) standards.

Information regarding the package 840 may be distributed to various product designers, such as via a component library stored at a computer 846. The computer 846 may include a processor 848, such as one or more processing cores, coupled to a memory 850. A printed circuit board (PCB) tool may be stored as processor executable instructions at the memory 850 to process PCB design information 842 received from a user of the computer 846 via a user interface 844. The PCB design information 842 may include physical positioning information of a packaged semiconductor device on a circuit board, the packaged semiconductor device corresponding to the package 840 including the system of FIG. 1 or FIG. 2, or any combination thereof.

The computer 846 may be configured to transform the PCB design information 842 to generate a data file, such as a GERBER file 852 with data that includes physical positioning information of a packaged semiconductor device on a circuit board, as well as layout of electrical connections such as traces and vias, where the packaged semiconductor device corresponds to the package 840 including the system of FIG. 1 or FIG. 2, or any combination thereof. In other embodiments, the data file generated by the transformed PCB design information may have a format other than a GERBER format.

The GERBER file 852 may be received at a board assembly process 854 and used to create PCBs, such as a representative PCB 856, manufactured in accordance with the design information stored within the GERBER file 852. For example, the GERBER file 852 may be uploaded to one or more machines for performing various steps of a PCB production process. The PCB 856 may be populated with electronic components including the package 840 to form a represented printed circuit assembly (PCA) 858.

The PCA 858 may be received at a product manufacture process 860 and integrated into one or more electronic devices, such as a first representative electronic device 862 and a second representative electronic device 864. As an illustrative, non-limiting example, the first representative electronic device 862, the second representative electronic device 864, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 862 and 864 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although one or more of FIGS. 1-7 may illustrate remote units according to the teachings of the disclosure, the disclosure is not limited to these exemplary illustrated units. Embodiments of the disclosure may be suitably employed in any device that includes active integrated circuitry including memory and on-chip circuitry.

Thus, the system of FIG. 1 or FIG. 2, or any combination thereof, may be fabricated, processed, and incorporated into an electronic device, as described in the illustrative process 800. One or more aspects of the embodiments disclosed with respect to FIGS. 1-7 may be included at various processing stages, such as within the library file 812, the GDSII file 826, and the GERBER file 852, as well as stored at the memory 810 of the research computer 806, the memory 818 of the design computer 814, the memory 850 of the computer 846, the memory of one or more other computers or processors (not shown) used at the various stages, such as at the board assembly process 854, and also incorporated into one or more other physical embodiments such as the mask 832, the die 836, the package 840, the PCA 858, other products such as prototype circuits or devices (not shown), or any combination thereof. Although various representative stages of production from a physical device design to a final product are depicted, in other embodiments fewer stages may be used or additional stages may be included. Similarly, the process 800 may be performed by a single entity, or by one or more entities performing various stages of the process 800.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
a bit cell coupled to a first bit line and to a second bit line;
a sense amplifier coupled to the first bit line and to the second bit line;
a loop circuit configured to provide a sense amplifier enable signal to the sense amplifier in response to receiving a first signal; and
a wordline enable circuit configured to provide a wordline enable signal to a wordline driver in response to receiving a second signal,
wherein the loop circuit receives the first signal before the wordline enable circuit receives the second signal.

2. The apparatus of claim 1, further comprising a timing circuit responsive to an input signal, wherein the timing circuit comprises a first output to provide the first signal and a second output to provide the second signal.

3. The apparatus of claim 2, wherein the timing circuit comprises:
an input to receive the input signal;
a first set of gates to generate the first signal at the first output, wherein the first signal initiates operation of the loop circuit; and
a second set of gates to generate the second signal at the second output, wherein the second signal initiates operation of the word line enable circuit.

4. The apparatus of claim 1, wherein the loop circuit is programmable to adjust a delay of the sense amplifier enable signal.

5. The apparatus of claim 4, wherein the loop circuit is programmable to maintain a substantially constant delay between activation of a wordline signal by the wordline driver and activation of the sense amplifier enable signal, wherein the substantially constant delay is substantially independent of a supply voltage of a logic domain.

6. The apparatus of claim 5, wherein:
the supply voltage of the logic domain causes a delay of a logic circuit portion of the loop circuit to exceed the substantially constant delay; and
the loop circuit receiving the first signal before the wordline enable circuit receives the second signal enables a programmable circuit portion of the loop circuit to compensate for the delay of the logic circuit portion to maintain the substantially constant delay.

7. The apparatus of claim 5, wherein the wordline signal causes the bit cell to initiate a development of a voltage differential between the first bit line and the second bit line, wherein the sense amplifier has a threshold differential sensitivity, and wherein the substantially constant delay causes the voltage differential to exceed the threshold differential sensitivity before the sense amplifier generates an output indicative of a data value of the bit cell.

8. The apparatus of claim 1, wherein the loop circuit includes a programmable circuit portion and a logic circuit portion.

9. The apparatus of claim 8, wherein the programmable circuit portion includes multiple discharge devices that are controllable to enable an adjustable rate of discharge of a precharged dummy bit line.

10. The apparatus of claim 1, further comprising a static random access memory (SRAM) device that comprises the bit cell and the sense amplifier, wherein the bit cell is coupled to a wordline that is responsive to the wordline driver.

11. The apparatus of claim 1, implemented in at least one semiconductor die.

12. The apparatus of claim 1, further comprising a device selected from the group consisting of a set top box, a music player, a video player, an entertainment unit, a navigation device, a communications device, a personal digital assistant (PDA), a fixed location data unit, and a computer, into which the bit cell, the sense amplifier, the wordline enable circuit, and the loop circuit are integrated.

13. A method comprising:
receiving an input signal at a memory device that includes a bit cell that is coupled to a wordline and that is coupled to a sense amplifier via a first bit line and a second bit line; and
in response to receiving the input signal:
sending a first signal to a loop circuit to initiate an operation of the loop circuit; and
sending a second signal to a wordline enable circuit to initiate generation of a wordline signal at the wordline, wherein the first signal is sent before the second signal.

14. The method of claim 13, wherein the operation of the loop circuit generates a sense amplifier enable signal to enable the sense amplifier to detect a voltage differential of the first bit line and the second bit line.

15. The method of claim 13, wherein the wordline enable circuit is in a logic voltage domain having a first supply voltage and the bit cell is in a memory voltage domain having a second supply voltage and wherein the loop circuit includes a programmable circuit portion and a logic circuit portion, wherein the programmable circuit portion is adjustable to compensate for a delay of the logic circuit portion due to a supply voltage level of the logic voltage domain.

16. The method of claim 15, further comprising providing a control signal to multiple discharge devices of the programmable circuit portion to control a rate of discharge of a precharged dummy bit line.

17. The method of claim 13, further comprising programming the loop circuit based on a supply voltage of a logic domain to maintain a substantially constant delay between activation of the wordline signal and activation of the sense amplifier enable signal, wherein the substantially constant delay is substantially independent of a logic domain voltage.

18. The method of claim 17, further comprising generating the first signal by adding a first delay to the input signal and generating the second signal by adding a second delay to the first signal.

19. The method of claim 13, wherein sending the first signal and sending the second signal are performed at a processor integrated into an electronic device.

20. A computer readable tangible medium storing instructions executable by a computer, the instructions comprising:
instructions that are executable by the computer to generate an input signal at a memory device that includes a bit cell that is coupled to a wordline and that is coupled to a sense amplifier via a first bit line and a second bit line,
wherein in response to receiving the input signal, a first signal is sent to a loop circuit to initiate an operation of the loop circuit, and wherein in response to receiving the input signal, a second signal is sent to a wordline enable circuit to initiate generation of a wordline signal at the wordline, wherein the first signal is sent before the second signal.

21. The computer readable tangible medium of claim 20, wherein the instructions further comprise instructions that are executable by the computer to program the loop circuit based on a supply voltage to maintain a substantially constant delay between the wordline signal and the sense amplifier enable signal.

22. The computer readable tangible medium of claim 20, wherein the operation of the loop circuit generates a sense amplifier enable signal to enable the sense amplifier to detect a voltage differential of the first bit line and the second bit line.

23. The computer readable tangible medium of claim 20, wherein the instructions are executable by a processor integrated in a device selected from the group consisting of a set top box, a music player, a video player, an entertainment unit, a navigation device, a communications device, a personal digital assistant (PDA), a fixed location data unit, and the computer.

24. An apparatus comprising:
means for storing a data value;
means for determining the data value based on a differential voltage of a first bit line and a second bit line that are coupled to the means for storing;
means for providing an enable signal to the means for determining in response to receiving a first signal; and
means for providing a wordline enable signal to a wordline driver in response to receiving a second signal,
wherein the means for providing the enable signal receives the first signal before the means for providing the wordline enable signal receives the second signal.

25. The apparatus of claim 24, integrated in at least one semiconductor die.

26. The apparatus of claim 24, further comprising a device selected from the group consisting of a set top box, a music player, a video player, an entertainment unit, a navigation device, a communications device, a personal digital assistant (PDA), a fixed location data unit, and a computer, into which the means for storing and the means for determining the data value are integrated.

27. A method comprising:
a first step for receiving an input signal at a memory device that includes a bit cell that is coupled to a wordline and that is coupled to a sense amplifier via a first bit line and a second bit line; and
in response to receiving the input signal:
a second step for sending a first signal to a loop circuit to initiate an operation of the loop circuit; and
a third step for sending a second signal to a wordline enable circuit to initiate generation of a wordline signal at the wordline, wherein the first signal is sent before the second signal.

28. The method of claim 27, wherein the first step, the second step, and the third step are performed by a processor integrated into an electronic device.

29. A method comprising:
receiving a data file comprising design information corresponding to a semiconductor device; and
fabricating the semiconductor device according to the design information, wherein the semiconductor device comprises:
a bit cell coupled to a first bit line and to a second bit line;
a sense amplifier coupled to the first bit line and to the second bit line;
a loop circuit configured to provide a sense amplifier enable signal to the sense amplifier in response to receiving a first signal; and
a wordline enable circuit configured to provide a wordline enable signal to a wordline driver circuit in response to receiving a second signal,
wherein the loop circuit receives the first signal before the wordline enable circuit receives the second signal.

30. The method of claim 29, wherein the data file has a GDSII format.

31. A method comprising:
receiving design information comprising physical positioning information of a packaged semiconductor device on a circuit board, the packaged semiconductor device comprising:
a bit cell coupled to a first bit line and to a second bit line;
a sense amplifier coupled to the first bit line and to the second bit line;
a loop circuit configured to provide a sense amplifier enable signal to the sense amplifier in response to receiving a first signal; and
a wordline enable circuit configured to provide a wordline enable signal to a wordline driver circuit in response to receiving a second signal,
wherein the loop circuit receives the first signal before the wordline enable circuit receives the second signal; and
transforming the design information to generate a data file.

32. The method of claim 31, wherein the data file has a GERBER format.

* * * * *